(12) United States Patent
Higashi

(10) Patent No.: US 6,588,437 B1
(45) Date of Patent: Jul. 8, 2003

(54) SYSTEM AND METHOD FOR REMOVAL OF MATERIAL

(75) Inventor: Gregg S Higashi, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 174 days.

(21) Appl. No.: 09/712,732

(22) Filed: Nov. 14, 2000

Related U.S. Application Data
(60) Provisional application No. 60/165,542, filed on Nov. 15, 1999.

(51) Int. Cl.$^7$ ................................................. B08B 3/02
(52) U.S. Cl. ...................... 134/148; 134/157; 134/183; 134/902
(58) Field of Search ................................ 134/148, 158, 134/902, 183, 157, 182, 99.1

(56) References Cited

U.S. PATENT DOCUMENTS

| | | | |
|---|---|---|---|
| 4,021,278 A | * 5/1977 | Hood et al. | |
| 4,544,446 A | * 10/1985 | Cady | |
| 5,423,944 A | 6/1995 | Wong | 156/646.1 |
| 5,464,480 A | 11/1995 | Matthews | 134/1.3 |
| 5,503,708 A | 4/1996 | Koizumi et al. | 156/643.1 |
| 5,591,262 A | * 1/1997 | Sago et al. | |
| 5,762,708 A | * 6/1998 | Motoda et al. | |
| 5,927,303 A | * 7/1999 | Miya et al. | |
| 6,159,288 A | * 12/2000 | Satou et al. | |
| 6,202,656 B1 | * 3/2001 | Schmitt | |
| 6,240,933 B1 | 6/2001 | Bergman | 134/1.3 |
| 6,248,179 B1 | * 6/2001 | Severac et al. | |
| 6,273,104 B1 | * 8/2001 | Shinbara et al. | |
| 6,273,108 B1 | * 8/2001 | Bergman et al. | |
| 6,318,385 B1 | * 11/2001 | Curtis et al. | |
| 6,431,190 B1 | * 8/2002 | Oka et al. | |
| 6,440,320 B1 | * 8/2002 | Shinozaki | |

FOREIGN PATENT DOCUMENTS

| | | | |
|---|---|---|---|
| JP | 64-255538 | * | 1/1989 |
| JP | 4-302144 | * | 10/1992 |

OTHER PUBLICATIONS

European Patent Office 782,177 Jul. 1997.*
CRC Handbook of Chemistry and Physics, 1989–1990, 70$^{th}$ Edition, pp. F–117 and F–89.
Higashi 14 Patent Application, Ser. No. 09/712,517 filed on Nov. 14, 2000. (not prior art).

* cited by examiner

Primary Examiner—Frankie L. Stinson
(74) Attorney, Agent, or Firm—Ferdinand M. Romano

(57) ABSTRACT

Apparatus for removal of material in reactions having limited solubility and diffusion. An exemplary system removes unwanted material from the surface of a semiconductor wafer.

A flow apparatus is provided for removal of material from a work piece having at least one reaction region containing removable material. The apparatus may include first and second assemblies positionable in spaced-apart relation to form a zone extending between the two assemblies for movement of gaseous material. The first assembly may include a fixture positioned to receive the work piece with the reaction region of the work piece disposed in the zone to allow movement of the gaseous material thereover. A flow assembly is configured to transfer into the zone a gas comprising a condensable material and a reacting species.

In another embodiment a system for removal of material from a workpiece includes a chamber, a flow component and a support apparatus. The flow component is configured to pass gaseous material into the chamber at a selectable rate and allow exit of liquid and gaseous materials from the chamber. The support apparatus is configured to position the workpiece thereon with the surface region of the work piece oriented for contact with gaseous material passed into the chamber by the flow component. The system may further include a thermal control configured to provide a differential temperature between a portion of a work piece and gaseous material passed into the chamber.

22 Claims, 1 Drawing Sheet

SYSTEM AND METHOD FOR REMOVAL OF MATERIAL

RELATED APPLICATIONS

This is a conversion of provisional application Serial No. 60/165,542 filed Nov. 15, 1999. This application is related to Ser. No. 09/712,517 [Higashi 14] filed on even date herewith.

FIELD OF THE INVENTION

The invention relates to cleaning processes of the type incorporating soluble oxidants and, in preferred embodiments, relates to removal of photo-resist (PR) and associated by-products during the cleaning stages of integrated circuit manufacture.

BACKGROUND

It is well known that gas solubilities in liquid media such as water can decrease with rising temperature. In particular, this has been problematic for cleaning systems based on dissolved ozone. When ozone functions as an oxidant in water, e.g., to effect removal of material from a surface, it can be counter productive to increase the intrinsic reaction rate of the ozone by increasing temperature. That is, when the intrinsic rate increases, the overall speed at which the system operates to remove material does not increase and may decrease, due to reduced solubility of the oxidant at elevated temperature.

In the semiconductor industry many manufacturing steps involve photolithography. Photoresist is commonly patterned and etched on an exposed surface of a partially fabricated semiconductor wafer in order to transfer a feature from a photomask to the surface. The feature, defined in the photoresist, is then transferred into the wafer material through, for example, a selective etch process. By way of illustration, this technique is commonly used to define zones for ion implantation, shallow trench isolation, polysilicon interconnect and Damascene trenches for metallization schemes.

After the PR is patterned and etched, and after the patterned photoresist is used to etch the feature, it is necessary to remove photoresist or byproducts of the reactions. Conventionally, this has been accomplished with a cleaning process based on reaction of ozone with the material to be removed. For example, in a batch process, a group of wafers may be dipped in a solution of water and ozone, possibly under agitation, to effect the removal.

It is generally recognized that the reaction rate for ozone removal of PR and associated byproducts from a wafer surface is limited by diffusion of $O_3$ to near the water/PR interface. Recently it has been observed that the rate of removal can be increased by first placing the wafers in a chamber of elevated temperature. With the wafers positioned above a pool of heated water, water vapor condenses upon the wafer surfaces while $O_3$ is introduced into the chamber. In contrast to performing the reaction while the wafers are immersed in a bath of ozonated water, the wafers above the pool have a limited thickness of water on the surfaces. Since the PR strip rate is limited by diffusion of $O_3$ through the DI water, providing a relatively thinner layer of water for a given partial pressure of $O_3$ gas increases the net amount of $O_3$ diffusion to the water/PR interface; and this will result in an increased reaction rate relative to the reaction rate which would result when the ozone diffuses into a bath of water to reach the PR.

Nonetheless, with both the solubility and the diffusion of the reactant species so limited, the approach of placing wafers over a pool of water to diffuse the species through condensate, at best, provides a rate-limited reaction. If the diffusion rate and overall rate of material removal could be further increased, significant economies may be made available. Specifically, PR removal in a single wafer processing system would become more cost effective.

SUMMARY OF THE INVENTION

According to one embodiment of the invention, the removal of material in reactions having limited solubility and diffusion of gaseous material can be increased by controlling the thickness of the layer into which the reactant species diffuses. In another embodiment, the thickness of the layer and the diffusion of the gaseous material can be individually controlled. Apparatus and method are provided.

A flow apparatus is provided for removal of material from a work piece having at least one reaction region containing the removable material. The apparatus may include first and second assemblies positionable in spaced-apart relation to form a zone extending between the two assemblies for movement of gaseous material. The first assembly may include a fixture portion positioned to receive the work piece with the reaction region of the work piece disposed in the zone to allow movement of the gaseous material thereover. A flow assembly is configured to transfer into the zone a gas comprising a condensable material and a reacting species.

According to another embodiment a system is provided for removal of material from a workpiece having at least one surface region containing the removable material. The system includes a chamber, a flow component and a support apparatus. The flow component is configured to pass gaseous material into the chamber at a selectable rate and allow exit of liquid and gaseous materials from the chamber. The support apparatus is configured to position the workpiece thereon with the surface region of the work piece oriented for contact with gaseous material passed into the chamber by the flow component. The system may further include a thermal control configured to provide a differential temperature between a portion of a work piece positioned on the support apparatus and gaseous material passed into the chamber by the flow component.

A method for chemical processing is also provided wherein the thickness of a layer of condensate on a surface is actively controlled and a reactant species is diffused from a gaseous region overlying the surface into the layer. According to an exemplary embodiment for removal of material from a work piece having at least one surface region containing the removable material, a workpiece is placed in an atmosphere comprising a condensable gas and a reacting species. The partial pressure of the condensable gas is controlled to limit the formation of liquid condensation on the surface region.

According to a method for removing unwanted material from the surface of a semiconductor wafer, the wafer is placed in a zone having a controllable atmosphere and gaseous materials including a gaseous reactant and a condensing vapor are passed into the zone for contact with a wafer surface having the unwanted material thereon. The partial pressure of the condensing vapor in the zone is controlled to condense the vapor on the wafer surface at a selectable rate and cover the unwanted material with a condensate layer of desired thickness. The gaseous reactant is allowed to dissolve in the condensate.

In another embodiment for removing unwanted material from the surface of a semiconductor wafer, the wafer is placed in a chamber, gaseous materials including an oxidant and a condensing vapor are passed into the chamber for contact with a surface of the wafer having the unwanted material thereon, and vapor is condensed on the wafer surface at a predeterminable rate to cover the unwanted material with a layer of fluid. The oxidant is allowed to diffuse into the fluid at a selectable rate.

The foregoing background and summary have outlined general features of the invention. Those skilled in the art may acquire a better understanding of the invention and the preferred embodiments with reference to the drawings and detailed description which follow.

BRIEF DESCRIPTION OF THE DRAWINGS

A more complete understanding of the invention will be acquired from the detailed description which follows. When read in conjunction with the accompanying drawing, in which.

DETAILED DESCRIPTION OF THE INVENTION

Figure 1:
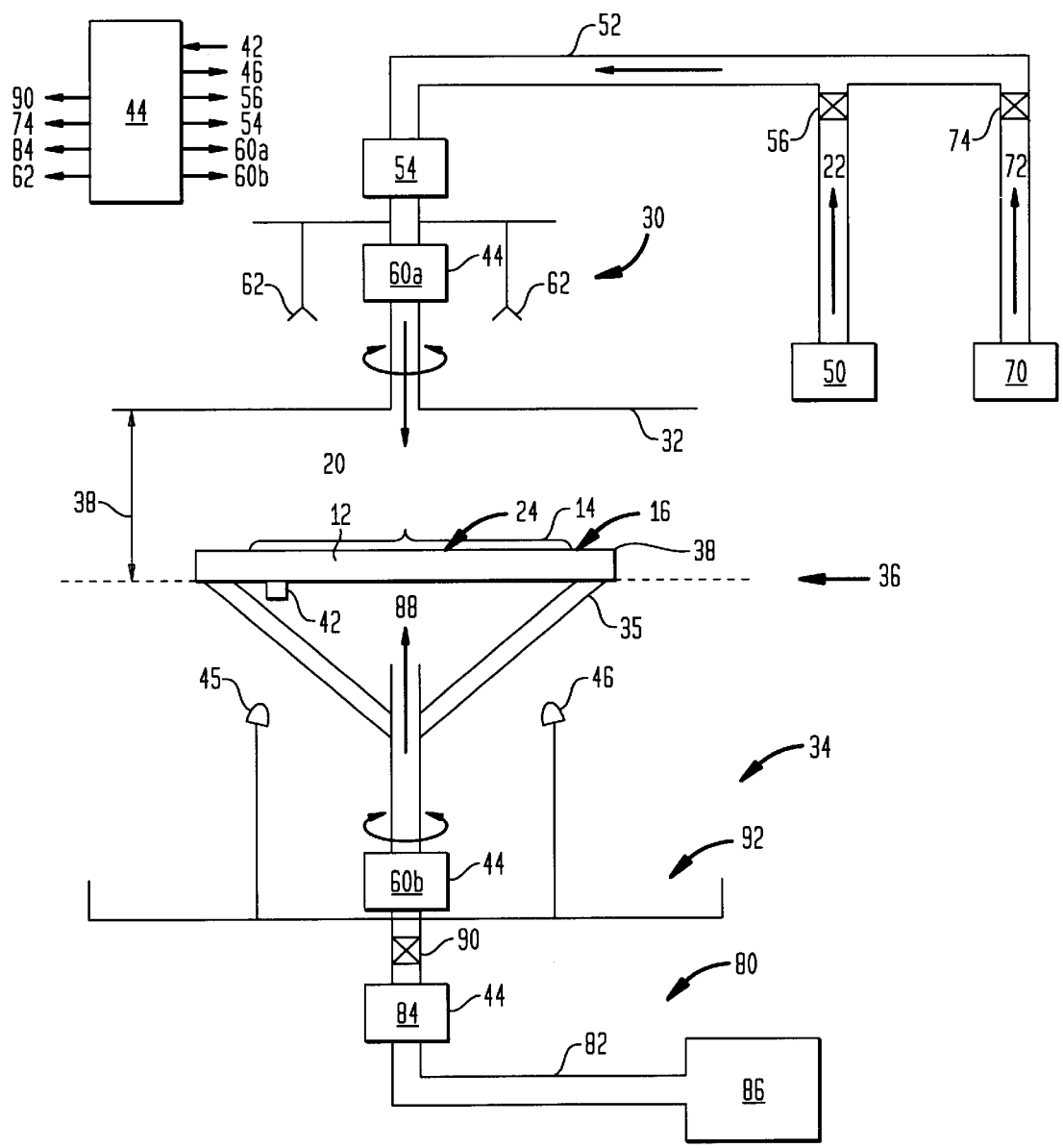
FIG. 1 illustrates in schematic form an exemplary embodiment of a system for removal of material from a work piece. Features presented in the drawing are not to scale.

Exemplary embodiments of the invention are schematically illustrated with reference to FIG. 1, wherein a flow system 10 is configured to remove material from a work piece. In this example the work piece is a partially fabricated semiconductor wafer 12 which may be of the type, for example, on which high density integrated circuits are formed. The wafer 12 includes at least one reaction region 14 on a surface 16 thereof. The region 14 contains material which is to be removed as part of a conventional photoresist pattern and etch sequence during semiconductor manufacture. It should be understood that several of the design features now illustrated are exemplary and only specific to the type of work piece and the type of material to be removed from the region 14. Further, the chemical materials chosen to perform the operation are exemplary and numerous variants will be apparent based on, for example, the desired reaction rate, preferred values of reaction variables, the material to be removed and features specific to the work piece. In the illustrated example the material being removed from the reaction region 14 is photo resist and byproducts thereof, e.g., $CO_2$. The system 10 may be used for removal of other materials, including atmospheric contaminants and various hydrocarbons, which may form on the surface 16.

In the system 10 the work piece wafer 12 is placed in a zone 20 which receives a flow of gaseous material 22 (indicated with arrows) injected toward the central portion 24 of the wafer surface 16. The reaction is based on dissolution of gaseous ozone in deionized water. Preferably, the ozone is delivered near the reaction region 14 by condensing water vapor (e.g., ten monolayers of $H_2O$ under steady state conditions) on the wafer surface 16 and allowing ozone to diffuse into the $H_2O$. Although the invention is not limited by any specific theory on the mechanisms of the desired reaction, it is believed that the presence of sufficient $O_3$ in water effects a reaction which results in dissolution of photo resist material and associated byproducts. The system 10 facilitates such removal in a rapid and controllable manner.

The system 10 includes a rotatable upper assembly 30 having a plane surface 32 and a rotatable lower assembly 34 including a fixture portion 35 for holding the wafer 12 along a plane 36. The plane 36 is indicated with a hatched line. The surface 32 and the plane 36 are in a spaced-apart relation. Preferably the distance between the plane surface 32 and the plane 36 is adjustable as notationally indicated by the arrow 38. With the wafer 12 mechanically secured to the fixture portion 35 in a conventional manner, the zone 20 largely corresponds to a volume between the surface 32 and the plane 36, extending, more or less, to the periphery 38 of the mounted wafer.

A wafer heating assembly provides thermal control of the wafer temperature. The heating assembly includes a thermal sensor 42 positioned to monitor the wafer temperature. The illustrated sensor is positioned for contact with the wafer in order to provide a calibrated electrical signal indicative of the wafer temperature. The temperature dependent signal generated by the sensor 42 is transmitted to a controller 44, e.g., by wire or radio signal, and the controller 44 regulates thermal input to the wafer 12 from one or more energy sources 46. Sources 46 may, for example, be an array of thermal elements which radiate infrared energy to the wafer 12, or they may be diode lasers with appropriate lens systems to direct the radiation to the wafer 12.

The gaseous material 22 is generated by an ozonating supply system 50. From the system 50 a mixture of water vapor and ozone is selectively transmitted through a feed line 52 for injection through the surface 32 to direct the gaseous material 22 into the zone 20 at or near the center portion 24 of the wafer 12. Movement of the material 22 into the feed line is through a valve 56 whose position is set by the controller 44. After entering the zone 20, a portion of the water vapor condenses on the wafer surface 16 and, wafer surface 16 toward the wafer periphery and exits the zone 20. Although not illustrated, texture or flow-enhancing paterns maybe formed along the surface 32 to facilitate desired movement of the mixture 22 along the wafer surface 16.

During operation of the flow system 10 a wafer 12, containing photoresist material to be removed from the reaction region 14, is positioned in the lower assembly 34 along the plane 36 so that the wafer surface 16 is spaced apart from the surface 32 of the upper assembly 30. With this arrangement the distance between the wafer surface 16 and the surface 32 may be adjusted by movement of one or both assemblies 30 and 34 to select an appropriate volume for the zone 20. Preferably, the volume of the zone 20 is determined for a prescribed flow rate, temperature and mix of the gaseous material 22 being injected into the zone 20. The flow rate should be selected so that the partial pressures of ozone and water vapor over the reaction region 14 are predominantly a function of the flow rate and properties of the injected gases, including any carrier gases incorporated in the material 22. Under these conditions the partial pressures of the ozone and the water vapor are relatively independent of pressure and temperature conditions outside the zone. Thus the zone 20 can develop conditions different from those of the adjoining atmosphere.

The temperature of the wafer surface and the resulting thin layer of condensed water formed on the surface 16 may be largely influenced by the temperature of the wafer. On the other hand, the temperature of gases in the zone 20 and above the condensed water will predominantly result from adjustments imparted to the material 22 by the heater assembly 54 as directed by the controller 44.

Under these conditions the zone 20 provides an atmosphere comprising a condensable gas, e.g., water vapor, wherein the temperature of the gas relative to the wafer surface 16 is controllable to influence the rate of condensation on the surface 16. Ozone or another gaseous reactant may diffuse into the condensation at a rate controllable by the partial pressure of the gaseous reactant. With sufficient ozone dissolved in the condensation, photoresist material is chemically removed from the reaction region 14. Although this removal process is understood to include diffusion of an oxidant such as ozone into the condensed layer, operation of the flow system 10 to effect such removal may not validate or depend upon any specific theory to describe a removal mechanism for the unwanted material.

The rate of reaction may be enhanced with radiation. For example, as illustrated in FIG. 1, with ozone as the oxidant, the wafer surface 16 may be irradiated with one or more ultra violet sources 62 positioned above the plane surface 32. To effect transmission of the radiation to the ozonated condensate on the surface 12, the surface 32 and other components may be formed of fused silica or other material having a suitably high transmission for the radiation.

Spinning of the wafer 12 provides another means of controlling the thickness of the fluid layer and facilitates movement of condensate (carrying reaction products) off the wafer. This in turn accelerates the development of new condensate near the reaction site and diffusion of more ozone therein. The overall effect is to further improve the removal rate of material at a temperature and speed suitable for volume manufacture of semiconductors and other products.

Once the reaction is under way or substantially complete, the flow velocity and condensation rate of the gaseous mixture can be modified to increase the rate at which material is rinsed off the surface 16. For example, removal of such may be enhanced by initially increasing the rate of condensation on the surface and increasing the spin rate of the wafer 12. The volumetric flow rate of the gaseous mixture from the center portion 24 to the wafer periphery 38 may be increased by decreasing the distance between the plane surface 32 and the plane 36. The temperature of the wafer surface 16 can be lowered relative to the temperature of the gaseous material 22 in order to increase the condensation rate. That is, the controller 44 may cut off thermal input to the wafer 12 from the energy source 46 while increasing the temperature of the gaseous material so that the surface 16 is at a lower temperature than the temperature of the gaseous material 22.

The wafer may be dried by altering the composition of the gaseous material 22 provided by the supply system 50 from water vapor and ozone to a relatively inert gas such as nitrogen. The nitrogen may be passed over the wafer surface at a high flow rate while both the wafer 12 and the upper assembly surface 32 spin. The flow rate of the nitrogen can be readily increased by bringing the surface 32 closer to the plane 36. The nitrogen may be heated under the direction of the controller 44 to enhance vaporization of the condensate. The controller can also turn on thermal input to the wafer 12 from the energy source 46 to increase the rate of evaporation.

A feature of the invention is the ability to control and increase the rate of a diffusion limited reaction which heretofore has been limited by the thickness of the condensate layer into which the gaseous reactant is dissolved. By actively controlling the thickness of the condensate layer the concentration of gaseous reactant in the condensate may be rapidly increased. An exemplary means of effecting this increased diffusion rate has been illustrated, e.g., by effecting independent control of wafer temperature and gas temperature over the wafer, or by controlling pressure in the zone 20, thereby modifying the relative humidity that controls the thickness of the layer of condensate (e.g., water on the wafer surface). The condensation rate can be controlled and limited to maximize the reaction rate.

In the disclosed embodiment the gaseous reactant is an oxidant. Several variables controlling the state conditions of the oxidant, e.g., $O_3$, may be modified to adjust the rate at which the oxidant reacts with the unwanted material, e.g., PR. The variables include temperature at the point of reaction (which may be varied by warming or cooling the wafer surface) and partial pressure of $O_3$ (which may be varied by modifying the net gas concentration or the pressure in the zone 20).

Generally the invention as disclosed may be performed in a chamber. In the illustrated embodiment of the flow system 10, the chamber is a zone 20 open to atmospheric conditions, but capable of accommodating state conditions different from the adjoining atmosphere. In a conventional closed chamber, e.g., one wherein the enclosed environment is sealed from the atmosphere, pressure can be varied by controlling the rate at which gas exits the chamber relative to both the volume of gas entering the chamber and the net volume increase due to by-products formed in the chamber. However, for the zone 20, as described with reference to FIG. 1, the distance between the upper assembly surface 32 and the wafer 12 can be adjusted to vary state conditions such as pressure in the zone without having to modify the temperature, composition or volumetric flow rate of gaseous material injected to the zone 20.

Thus vapor condensation rate can be controlled independent of predominant state conditions in the chamber vessel, e.g., zone 20 to vary the thickness of the fluid layer and maximize the diffusion rate of the reactant, e.g., ozone, into the condensed fluid. Another means of establishing conditions under which the rate of condensation is controlled is to inject a liquid 72, such as water, from a reservoir 70 into the feed line 52. A valve 74, permitting movement of the liquid into the feed line 52, is governed by the controller 44. The controller 44 elevates the liquid to a desired temperature as the liquid passes through the heater assembly 54 so that the liquid 72, upon entry to the zone 20, undergoes thermal interaction with the wafer surface 16 while the wafer spins. Once the surface 16 reaches a desired temperature the controller closes the valve 74 and opens the valve 56 so that gaseous material is injected through the feed line 52 at a different, e.g., higher, temperature than that of the liquid 72. This process could be cyclic in order to sustain optimal temperature differentials and periodically wash reacted material off the surface 16.

The rate at which the wafer 12 is heated can be further increased with a supplemental feed assembly 80 comprising a feed line 82, a heater 84 in the feed line 82, under direction of the controller 44, and a reservoir 86 providing a liquid 88 into the feed line for transmission through the heater 84 and to the wafer 12. The liquid, e.g., water, is sprayed upon the undersurface 90 of the wafer 12 for thermal transfer. The controller 44 regulates movement of the heated liquid 88 with a valve 90. Various liquids (including condensate containing removed material, liquid 72 and liquid 88) are permitted to collect in a drain region 92 for removal.

Generally the diffusion rate is controllable by the relative pressures of the vapor and the reactant gas as well as the overall chamber pressure. Further, with the heater assembly 54 placed exterior to the chamber, e.g., outside of the zone 20, the temperature of the gaseous material 22 and wafer temperature are individually controllable. Although not illustrated, further control can be had over the reaction by individually injecting the condensable vapor and the gaseous reactant into the chamber in order to individually control their respective temperatures.

It should also be noted that the condensate need not be pure water. Other fluids such as methanol may be suitable and various mixtures, including those formed with inert materials, may be most useful in this application.

A system and method have been provided wherein the condensation rate of a vapor such as water can be controlled while separately controlling the reaction rate of an oxidant which dissolves in the condensed vapor. The vapor pressure of the reacting species can be modified relative to atmospheric pressure as well as the vapor pressure of other gaseous material in the chamber, e.g., the zone 20. The chamber gas concentration of the condensing vapor and the reacting species, and the temperature of the work piece surface, are all adjustable to control the overall rate at which the species, e.g., ozone, reacts with material on the surface of the work piece. The condensable vapor and the reacting species can be selectively directed to the work piece. In the case where the work piece is a semiconductor wafer, the gaseous materials are directed toward a center portion of the work piece such that they may flow toward the periphery as they exit the chamber.

The invention has been described with only a few illustrative embodiments while the principles disclosed herein provide a basis for practicing the invention in a variety of ways. Although the disclosed systems and methods have been illustrated for semiconductor manufacturing applications, the concepts are generally applicable to removal of materials from surfaces with reactant species that diffuse through a layer. Other constructions, although not expressly described herein, do not depart from the scope of the invention which is only to be limited by the claims which follow:

What is claimed is:

1. A flow apparatus for removal of material from a work piece having at least one reaction region containing the removable material, the apparatus comprising:

first and second assemblies within a housing positionable in spaced-apart relation to form a zone extending between the two assemblies for movement of gaseous material, the first assembly including a fixture portion positioned to receive the work piece with the reaction region of the work piece disposed in the zone to allow movement of the gaseous material thereover, the second assembly including a flow assembly configured to transfer into the zone, directly from a position over the fixture portion, a gas comprising a condensable material and a reacting species; and controls for modifying the state conditions within the zone relative to the state conditions in other regions within the housing.

2. The apparatus of claim 1 wherein the fixture portion is positioned to receive the work piece along a plane and the second assembly includes a surface spaced apart from the plane so that the zone extends between the plane and the second assembly surface.

3. The apparatus of claim 2 wherein the zone is bounded by the plane and the second assembly surface.

4. The apparatus of claim 1 wherein the zone is open to the atmosphere.

5. The apparatus of claim 4 wherein state conditions within the zone are isolated from the atmosphere when the flow assembly transfers the gas into the zone under conditions which result in removal of the material from the reaction region.

6. The apparatus of claim 1 further including a thermal assembly configured to selectively elevate the temperature of a work piece reaction region positioned in the zone.

7. The apparatus of claim 1 further including a thermal assembly configured to selectively elevate the temperature of a work piece reaction region positioned on the fixture portion relative to the temperature of gas transferred into the zone by the flow assembly.

8. The apparatus of claim 1 further including a thermal control configured to selectively adjust the temperature of a work piece reaction region positioned in the zone and the temperature of the gas entering the zone relative to one another.

9. The apparatus of claim 1 further including a system for generating gaseous material comprising ozone and water vapor coupled to transmit the gaseous material to the flow assembly for injection through the zone.

10. The apparatus of claim 1 wherein the second assembly includes a surface spaced apart from the fixture portion to define the zone in a region between the second assembly surface and a work piece positioned on the fixture portion so that vapor pressure in the zone is controllable by modifying the distance between the second assembly surface and the work piece.

11. The apparatus of claim 1 wherein the vapor pressure in the zone is controllable by modifying the volumetric flow rate of gaseous material entering the zone.

12. The apparatus of claim 1 wherein the flow assembly includes a feed line configured to transmit the gaseous material through the second assembly and direct flow of the gaseous material from a central portion of the work piece to an outer portion of the work piece.

13. The flow apparatus of claim 1 wherein the controls for modifying the state condition in the zone include a controller for modifying the flow velocity and condensation rate of the gas.

14. A system for removal of material from a work piece having at least one surface region containing the removable material comprising:

a chamber;

first and second assemblies within the chamber positionable in spaced-apart relation to form a zone extending between the two assemblies for movement of gaseous material, the second assembly including a flow component configured to pass gaseous material into the chamber at a selectable rate and allowing exit of liquid and gaseous materials from the chamber, the first assembly including support apparatus configured to position the work piece thereon with the surface region of the work piece oriented for contact with gaseous material passed into the chamber by the flow component; and a thermal control configured to provide a selectable differential temperature between a portion of the work piece positioned on the support apparatus and gaseous material passed into the chamber by the flow component; and controls for modifying the state conditions within the zone relative to the state conditions in other regions within the chamber.

15. The system of claim 14 wherein the thermal control system includes an energy source configured to elevate the temperature of the work piece relative to another temperature in the chamber.

16. The system of claim 14 wherein the thermal control system includes a heater coupled to elevate temperature of gaseous material prior to being passed into the chamber.

17. The system of claim 14 wherein the flow component includes a feed line extending toward the support apparatus so that when the work piece is positioned on the support apparatus gas discharged from the feed line flows along the surface region.

18. The system of claim 14 wherein the flow component includes a feed line extending toward the support apparatus so that, when the work piece is positioned on the support apparatus, gas discharged from the feed line flows directly toward the surface region, said system further including a flow control member positionable along the surface region to direct flow of gaseous material along the work piece surface region.

19. The system of claim 14 wherein the chamber is a region defined in part by a flow control surface spaced apart from the support apparatus.

20. The system of claim 19 wherein the support apparatus is configured to receive a work piece along a plane and the flow control member includes a plane surface positioned to define a region between the plane surface and a positioned work piece through which gaseous material is transmitted to react with the surface region.

21. The system of claim 20 wherein the distance between a positioned work piece and the plane surface is variable.

22. The system of claim 14 wherein the flow component is capable of injecting a liquid of controllable temperature into the chamber for contact with the work piece to thermally control the temperature of the work piece.

* * * * *